(12) United States Patent
Hamamoto et al.

(10) Patent No.: US 11,528,045 B2
(45) Date of Patent: Dec. 13, 2022

(54) SIGNAL TRANSMISSION DEVICE

(71) Applicant: Hitachi, Ltd., Tokyo (JP)

(72) Inventors: Goro Hamamoto, Tokyo (JP); Yutaka Uematsu, Tokyo (JP); Masahiro Shiraishi, Tokyo (JP); Tatsuyuki Ootani, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 17/514,100

(22) Filed: Oct. 29, 2021

(65) Prior Publication Data
US 2022/0182086 A1 Jun. 9, 2022

(30) Foreign Application Priority Data

Dec. 3, 2020 (JP) .............................. JP2020-200818

(51) Int. Cl.
*H04B 1/04* (2006.01)
(52) U.S. Cl.
CPC .... *H04B 1/0475* (2013.01); *H01L 2924/0002* (2013.01)
(58) Field of Classification Search
CPC ....... H01L 2924/0002; H01L 2924/181; H01L 27/2463; H01L 45/12; H01L 45/1233; H01L 45/1253; H01L 45/16; H01L 51/4226; H02M 3/33592; H02M 1/08; H02M 3/33523; H02M 3/158; H02M 1/088; H02M 3/003; H02M 3/01; H02M 7/003; H02M 3/285; Y02B 70/10; Y02B 20/00; Y02B 90/20; Y02B 10/10; Y02B 20/30; Y02B 20/40; Y02B 40/00; Y02B 70/30; Y02B 70/3225
USPC ........................................................ 375/295
See application file for complete search history.

(56) References Cited

U.S. PATENT DOCUMENTS 6,239,985 B1 * 5/2001 Feraud ................. H05K 7/1459
333/100
2021/0344194 A1 * 11/2021 Pachoud .............. H02G 15/113

FOREIGN PATENT DOCUMENTS

JP 09-275398 A 10/1997

* cited by examiner

*Primary Examiner* — Eva Y Puente
(74) *Attorney, Agent, or Firm* — Mattingly & Malur, PC

(57) ABSTRACT

A signal transmission device has a multi-point wiring structure in which termination resistors are mounted on both ends of a cable, and a plurality of PCBs connected to the cable transmit a signal through the cable. The PCB of a host node includes: a connector connected to the cable; a transformer unit that is connected to the connector via a first PCB transmission line and insulates the connector; an RS 485 transceiver that is connected to the transformer unit via a second PCB transmission line and transmits the signal to the PCB of another node or receives the signal from the PCB of another node; and AC termination that is provided in at least one of the first PCB transmission line and the second PCB transmission line and suppresses resonance and antiresonance in a reflection frequency characteristic of noise.

8 Claims, 16 Drawing Sheets

SIGNAL TRANSMISSION DEVICE

CROSS-REFERENCE TO RELATED APPLICATION

The present application claims priority from Japanese application JP2020-200818, filed on Dec. 3, 2020, the contents of which is hereby incorporated by reference into this application.

BACKGROUND OF THE INVENTION

1. Field of the Invention

The present invention relates to a signal transmission device.

2. Description of the Related Art

As one scheme of an interface circuit, a TIA/EIA-485 (RS485) transmission scheme is often used in an industrial field. The RS485 covers a transmission distance of up to 1200 m in the standard. A plurality of nodes are provided in a transmission line of RS485, and signals are transmitted or extracted from these nodes. Since the RS485 is standardized to transmit a signal over a long distance, it is necessary to design a printed circuit board (PCB) connected to the nodes on the assumption that GND potentials of the respective nodes are not the same. Therefore, it is necessary to make a power supply in the PCB, a power supply for an RS485 transceiver, and the GND have insulating structures and to mount a dedicated power supply IC for an RS485 line in an insulated area.

As a configuration for solving the above problem, CUnet (registered trademark), which performs insulation using a pulse transformer (hereinafter, also referred to as "PTR") configured in the PCB, is known. Recommended data rates for CUnet are only 3 Mbps (1.5 MHz), 6 Mbps (3 MHz) and 12 Mbps (6 MHz).

In recent years, there has been a demand for a specification capable of transmitting a signal at a slow data rate of less than 1 Mbps, for example, in addition to the data rates recommended by CUnet. However, when a signal transmission device is configured using one type of PTR, which can cover from the data rates recommended by CUnet to the slow data rate of less than 1 Mbps, magnetic saturation of the PTR becomes a problem. When the magnetic saturation occurs, it is difficult to correctly obtain the amplitude of the signal. Therefore, it is necessary to select a PTR that does not cause magnetic saturation even at a wide range of data rates in order to avoid the magnetic saturation of the PTR.

When a cross-sectional area of a PTR core is increased in order to reduce a magnetic flux density of a PTR and prevent magnetic saturation, the PTR is increased in size. Further, it is necessary to increase the number of windings of a coil in order to increase an L component of an induction portion in order to increase an ET product (product of a voltage E applied to a transformer and a voltage application time T). As a result, a leakage inductance and a line-to-line capacitance also tend to increase. As a result, "0" and "1" of the signal are inverted, and the signal is not sometimes correctly read.

Here, a case will be considered in which an intermediate node between a plurality of nodes arranged in order transmits a signal to another node in a signal transmission device in which a PTR is mounted on each of PCBs and the PCBs used as nodes have a multi-point wiring structure. The multi-point wiring structure is a structure in which the respective nodes can transmit and receive a signal. Further, an operation in which one node transmits a signal to another node is also referred to as a "drive".

It is required that a signal waveform does not enter a prescribed threshold (threshold voltage) in order for a node as a signal transmission destination to accurately read a received signal. However, when the intermediate node is driven, a deep horn-like noise waveform that reaches an amplitude intermediate potential of the signal waveform is observed with respect to a signal, reflected by the PTR at each node, particularly in an adjacent node adjacent to the intermediate node, and this noise waveform enters the threshold. If the signal waveform is disturbed due to the influence of the noise waveform that has entered the threshold, there is a possibility that the signal is erroneously read. In this case, the transmission and reception of the signal between the plurality of nodes is hindered.

JP H9-275398 A discloses a technique for modularizing a pulse transformer and a termination resistor configured to couple a line termination device of a physical layer used in an ATM-LAN system to a transmission line. JP H9-275398 A describes that a hybrid integrated circuit, configured to couple a line termination device for forming an ATM-LAN physical layer interface to a transmission line, has a termination resistor for characteristic impedance matching with the transmission line.

SUMMARY OF THE INVENTION

Even in a multi-point wiring structure in which a signal of several hundred kbps in which a time per bit is on the order of μs is transmitted, it is necessary to insulate each node. However, in a case where a large PTR of the order of 1 mH that does not cause magnetic saturation is commonly used for transmission of signals from several hundred Kbps to a data rate of 10 Mbps (20 MHz) or more for each node, the waveform quality deteriorates as the noise waveform enters the threshold. Therefore, it is necessary to suppress reflection noise from the PTR of another node, which is a factor of the deterioration in waveform quality, and reflection and superimposition of a signal from the PTR of the other node due to a signal change of the own bit.

JP H9-275398 A described above merely describes the general technique of modularizing the pulse transformer and the termination resistor. Further, even when the technique described in JP H9-275398 A is used, the deterioration of waveform quality is not prevented in the case where the large PTR is used for the signal transmission.

The present invention has been made in view of such a situation, and an object thereof is to provide a signal transmission device capable of suppressing waveform quality deterioration in signal transmission at various data rates.

A signal transmission device according to the present invention has a multi-point wiring structure in which termination resistors are mounted at both ends of a transmission line, and a plurality of signal transmission substrates connected to the transmission line transmit a signal through the transmission line. One signal transmission substrate among the signal transmission substrates includes: a connection unit that is connected to the transmission line and transmits the signal to the transmission line or receives the signal from the transmission line; a transformer unit that is connected to the connection unit via a first substrate internal transmission line and insulates the connection unit; a transmission and reception unit that is connected to the transformer unit via a second substrate internal transmission line and transmits the signal to another signal transmission substrate among the signal transmission substrates or receives the signal from the other signal transmission substrate; and a termination unit that is provided in at least one of the first substrate internal transmission line and the second substrate internal transmission line and suppresses resonance and antiresonance in a reflection frequency characteristic of noise.

Further, another signal transmission device according to the present invention also has a multi-point wiring structure in which termination resistors are mounted at both ends of a transmission line, and a plurality of signal transmission substrates connected to the transmission line transmit a signal through the transmission line. One signal transmission substrate among the signal transmission substrates includes: a connection unit that is connected to the transmission line and transmits the signal to the transmission line or receives the signal from the transmission line; a transformer unit that is connected to the connection unit via a first substrate internal transmission line and insulates the connection unit; and a transmission and reception unit that is connected to the transformer unit via a second substrate internal transmission line and transmits the signal to another signal transmission substrate among the signal transmission substrates or receives the signal from the other signal transmission substrate. A line length between the connection unit and another connection unit included in the other signal transmission substrate is set to a length calculated from a time during which a signal is reciprocally transmitted, the time equivalent to an integral multiple of a signal change period using a Manchester encoding scheme.

According to the present invention, for example, it is possible to provide the signal transmission device capable of suppressing the waveform quality deterioration due to reflection noise from a PTR of another node and performing the signal transmission at various data rates. Other objects, configurations, and effects which have not been described above become apparent from embodiments to be described hereinafter.

DESCRIPTION OF THE PREFERRED EMBODIMENTS

Hereinafter, embodiments of the present invention will be described with reference to the accompanying drawings. In the present specification and drawings, constituent elements having substantially the same function or configuration will be denoted by the same reference sign, and the redundant description thereof will be omitted.

[Configuration Example of Conventional Signal Transmission Device]

Figure 1:
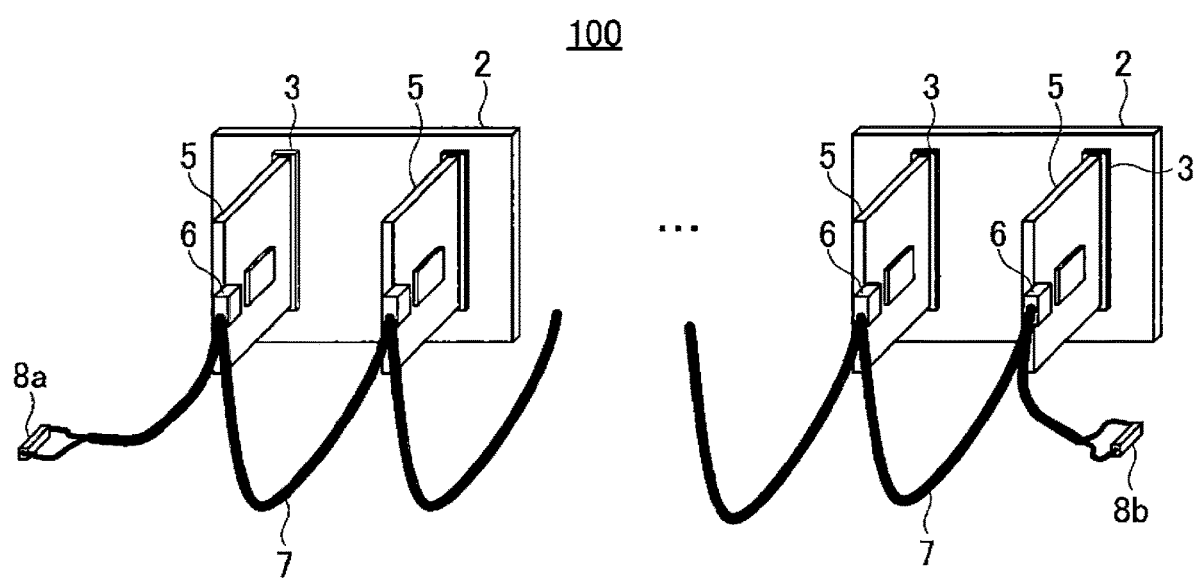
FIG. 1 is an external perspective view of a conventional signal transmission device configured using RS485.

First, a configuration example of a conventional signal transmission device using a transmission line of RS485 will be described with reference to FIGS. 1 and 2. FIG. 1 is an external perspective view of a conventional signal transmission device 100 configured using RS485. The signal transmission device 100 includes motherboards 2, RS485 devices 3, PCBs 5, connectors 6, a cable 7 (an example of a transmission line), and termination resistors 8a and 8b. A set of the PCB 5 and the connector 6 is treated as one node. Each of the motherboards 2 is set in a different housing (not illustrated).

Two sets of the PCBs 5 inserted and fixed to the RS485 devices 3 are installed on one motherboard 2. The connector 6 is formed on the PCB 5. The connectors 6 provided on the respective PCBs 5 are sequentially connected by the cable 7.

In a topology forming the signal transmission device 100, the termination resistors 8a and 8b are mounted on both ends of the cable 7 laid according to a transmission standard such as the RS485. In the signal transmission device 100, the cable 7 is a main transmission line of a signal. The termination resistors 8a and 8b may be inside or outside the PCB 5 as long as the termination resistors 8a and 8b are located at both ends of the topology. Note that FIG. 2 to be described later illustrates an example in which the termination resistor 8a is provided inside a PCB 5(1). In the following description, the PCB 5 is used as an example of a signal transmission substrate.

Figure 2:
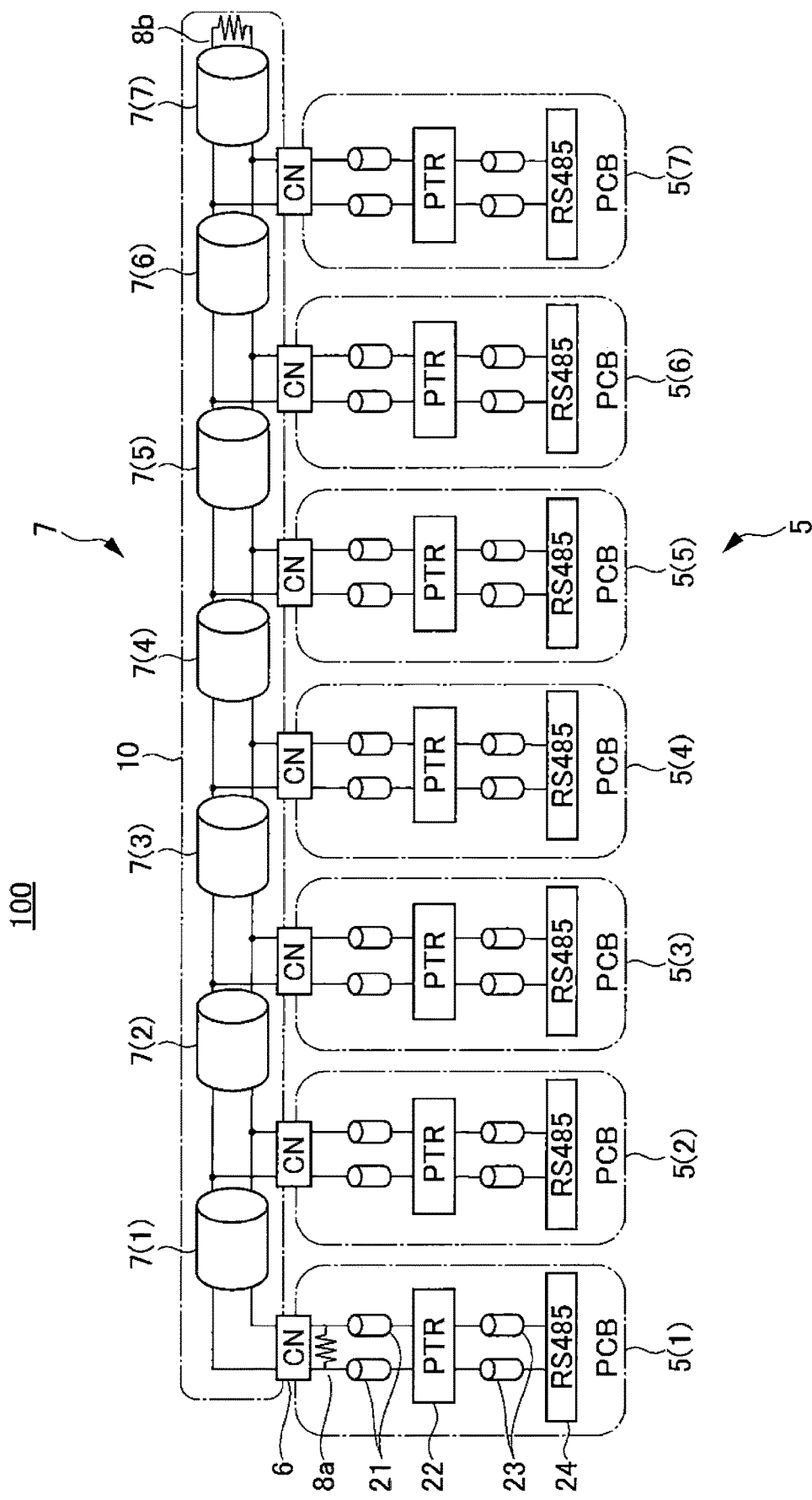
FIG. 2 is a block diagram illustrating a functional configuration example of the conventional signal transmission device.

FIG. 2 is a block diagram illustrating a functional configuration example of the conventional signal transmission device 100. Here, an example of a wiring structure of the signal transmission device 100 in which each of the PCBs 5 is insulated will be described.

In the signal transmission device 100, a node is identified by a numerical value in parentheses added to a cable and a PCB. Then, a plurality of cables 7(1) to 7(7) are connected in order. The PCB 5(1) is connected to one end of the cable 7(1). Further, a PCB 5(2) is connected between the cables 7(1) and 7(2). Hereinafter, PCBs 5(3) to 5(7) are similarly connected between the cables 7(2) and 7(3), . . . , and between the cables 7(6) and 7(7), respectively. The termination resistor 8b is connected to the other end of the cable 7(7).

In the following description, the cables 7(1) to 7(7) are referred to as the cable 7 when not distinguished. Further, the PCB 5(1) to the PCB 5(7) are referred to as the PCB 5 when not distinguished. Further, the PCB 5 connected to the cable 7 is also referred to as a "node". A line length between two nodes (for example, the PCB 5(1) and the PCB 5(2)) is also referred to as an "inter-node distance".

Here, an internal configuration example of the PCB 5(1) will be described focusing on the PCB 5(1). In FIG. 2, the respective functional units configured in the PCB 5(1) are denoted by reference signs, and reference signs are not described in the PCBs 5(2) to 5(7) having the same functional units as the PCB 5(1).

The PCB 5(1) includes the connector 6 connected to an end of the cable 7(1), the termination resistor 8a connected to the connector 6, a PCB transmission line 21 (an example of a first substrate internal transmission line), a pulse transformer (PTR) 22 (an example of a transformer unit), a PCB transmission line 23 (an example of a second substrate internal transmission line), and an RS485 transceiver 24 (an example of a transmission and reception unit). Note that the termination resistor 8a is not provided in the PCBs 5(2) to 5(7). In the following drawings, the connector 6 is described as "CN", and the RS485 transceiver 24 is described as "RS485".

The RS485 transceiver 24 is responsible for transmission and reception of a signal from a host node to another node performed by the RS485 device 3 illustrated in FIG. 1. During the signal transmission of the RS485 device 3, a signal is transmitted from the RS485 transceiver 24 to the cable 7(1) via the PCB transmission line 23, the PTR 22, the PCB transmission line 21, and the connector 6. During the signal reception of the RS485 device 3, the RS485 device 3 receives a signal from the cable 7(1) via the connector 6, the PCB transmission line 21, the PTR 22, the PCB transmission line 23, and the RS485 transceiver 24.

Figure 3:
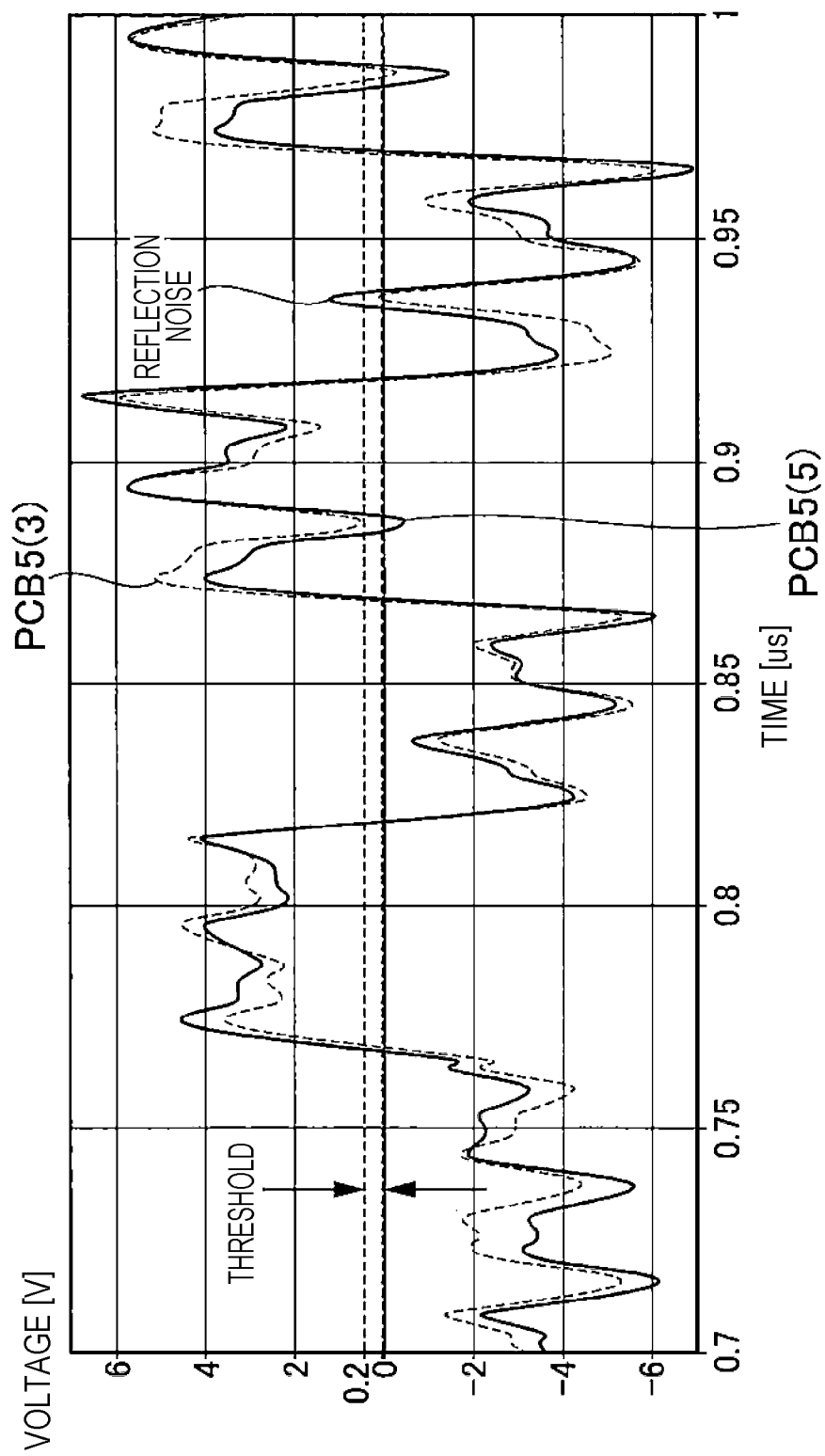
FIG. 3 is a diagram illustrating examples of signal waveforms that appear at adjacent nodes when an intermediate node is driven in a configuration in which an inter-node distance is 1.5 m in the conventional signal transmission device.

FIG. 3 is a diagram illustrating examples of signal waveforms that appear at adjacent nodes when an intermediate node is driven in a configuration in which an inter-node distance is 1.5 m in the conventional signal transmission device 100. In FIG. 3, a horizontal axis represents time [μs], and a vertical axis represents a voltage [V].

Here, it is assumed that the intermediate node is the PCB 5(4) and the adjacent nodes are the PCB 5(3) and the PCB 5(5). The PCB 5(4) as the intermediate node is driven at 10 Mbps (20 MHz). A broken line in FIG. 3 represents the signal waveform of the PCB 5(3), and a solid line in FIG. 3 represents the signal waveform of the PCB 5(5). Further, thresholds for enabling the RS485 transceiver 24 to correctly read the signal waveforms are set to 0 V and 0.2 V.

In FIG. 3, waveforms of the PCB 5(3) and the PCB 5(5) are disturbed between 0.7 and 0.85 μs, but none of the waveforms reaches the threshold. However, noise (referred to as "reflection noise") generated by reflection of the PTR 22 of the other node is superimposed on waveforms of the next bit and subsequent bits while a signal repeatedly changes. Here, examples of the other node include all the nodes (the PCBs 5(1) to 5(4) and the PCBs 5(6) and 5(7) illustrated in FIG. 2) other than the PCB 5(5) in a case where the host node is the PCB 5(5).

Between 0.85 and 0.9 μs, the signal waveform of the PCB 5(5) reaches the threshold of 0 V of the RS485 transceiver 24. Conversely, the signal waveform of the PCB 5(5) reaches the threshold of 0.2 V of the RS485 transceiver 24 between 0.9 and 0.95 μs. In this manner, it can be seen that the influence of the reflection noise on the signal waveform of the adjacent node increases as time elapses.

The recessed noise reaching the threshold is the reflection noise from the other node. Therefore, the noise is attenuated by the PTR 22 provided in the PCB 5 of the node in the middle of the noise transmission and a branch point of the cable 7. In addition, a frequency component of the noise is on the order of several hundred MHz. Therefore, when the inter-node distance exceeds 10 m in a case of a general twisted pair cable (having a wire diameter of about Φ0.18 to Φ0.7) used as a main transmission path, noise is attenuated by the transmission path, and reflection noise does not become a recess reaching a threshold. However, in a case where the signal transmission device 100 is configured with the inter-node distance of up to 10 m, the noise attenuation by the cable 7 is not sufficient, and thus, it is necessary to suppress the noise from being recessed. In particular, the reflection noise from the PCBs 5(2) and 5(6) is dominant in the signal transmission device 100 having the configuration illustrated in FIG. 2.

In sampling of a Transistor-Transistor-Logic (TTL) output signal of the RS485 transceiver 24 that has received a differential vibration, the sampling is performed several times for a differential signal unit bit, and bit determination is performed by majority decision or a method similar thereto. Therefore, even if a noise waveform enters a threshold in the middle of being directed to a DC level (noise avoidance area), obtained by subtracting a time corresponding to a rise time Tr and a fall time Tf from a unit bit time, there is no problem as long as being at any known timing. However, particularly when the noise waveform enters the threshold within the time (noise avoidance area) obtained by subtracting the rise time Tr and the fall time Tf from the unit bit time, a risk of a bit recognition error in the RS485 transceiver 24 increases.

That is, in the signal transmission device 100 having the conventional configuration, a risk of erroneous bit determination increases when the RS485 transceiver 24 performs sampling an arbitrary number of times within a time per bit. Causes thereof include an increase of a ratio of the entry time of the noise waveform to the threshold due to an increase in sampling speed, and an increase in waveform distortion due to intersymbol interference that is superposition of noise caused by a previous bit change.

Therefore, as a method for solving the waveform quality in the transmission path using the PTR 22, JP H9-275398 A proposes a method for achieving impedance matching of a line by arranging a termination resistor for characteristic impedance matching with a transmission line close to the PTR 22 for reception. However, in a case where the scheme disclosed in JP H9-275398 A is applied to a multi-point wiring structure such as RS485, it is necessary to provide the termination resistor near the PTRs 22 of the respective nodes. As a result, voltage division by a combined resistance value of the plurality of termination resistors occurs, so that it is difficult to obtain a desired signal amplitude.

On the other hand, individual resistance value increase if being adjusted to satisfy the combined resistance value increase in order to obtain the desired signal amplitude, so that the impedance matching at each node becomes difficult. Here, an AC termination scheme using the following Formula (1) is known as a method for avoiding the voltage division.

$$Ct(pF) > 2 * (\text{unidirectional cable delay [ps]})/\text{characteristic impedance } [\Omega] \quad (1)$$

<Configuration Example of AC Termination>

Figure 4:
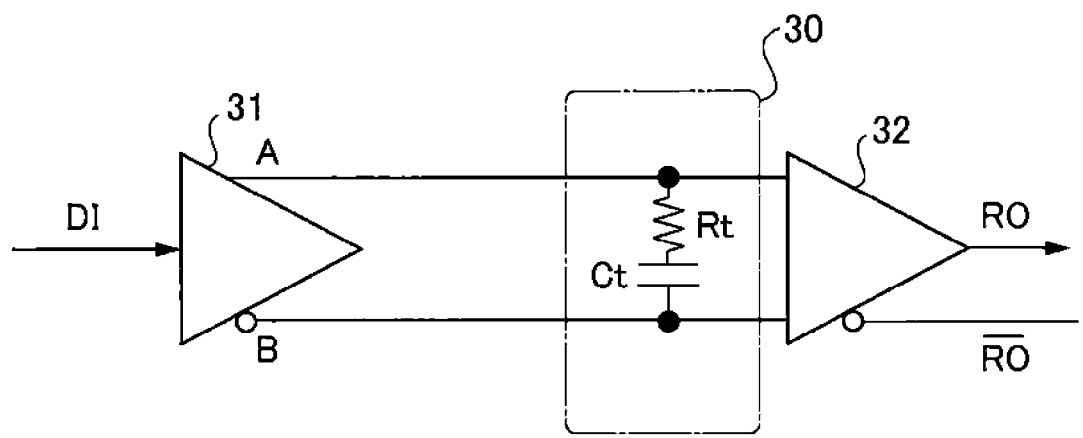
FIG. 4 is a diagram illustrating a configuration example of a differential signaling interface circuit.

A configuration example of AC termination 30 used in the above-described AC termination scheme will be described. FIG. 4 is a diagram illustrating a configuration example of a differential signaling interface circuit.

The differential signaling interface circuit includes a differential output driver 31 and a differential input receiver 32. The AC termination 30 is provided on the receiver 32 side. The AC termination 30 has a configuration in which a capacitor is connected in series to a resistor connected in parallel to the receiver 32. In FIG. 4, DI represents a driver input, and RO represents a receiver output. Further, RO with an upper bar represents an inverted output of the receiver output.

A line A and a line B are defined as a differential pair between the driver 31 and the receiver 32. The driver 31 outputs a polarity of a signal of one of the lines A and B with the polarity opposite to a polarity of a signal output from the other line. If the line A is closer to the positive side than the line B at a receiver input, the receiver output becomes logic high (RO=1). If the line B is closer to the positive side than the line A at the receiver input, the receiver output becomes logic low (RO=0).

Meanwhile, in a case where the capacitor having the capacitance Ct illustrated in the above Formula (1) is used, the capacitance Ct of 115 pF (=15000/130) is required if the waveform graph of FIG. 3 in which the inter-node distance is 1.5 m is taken as an example. When such a capacitor having the capacitance Ct is used, a round waveform becomes remarkable at a high data rate, and it becomes difficult to secure the signal amplitude.

In the RS485 configuration with 1:N connection, a value of the capacitance Ct of the capacitor installed in the AC termination 30 calculated based on the above Formula (1) and a value of a resistance Rt are not suitable for the multi-point wiring structure. Here, "1" in the 1:N connection represents the number of nodes transmitting data, and "N" represents the number of nodes receiving data.

First Embodiment

Figure 5:
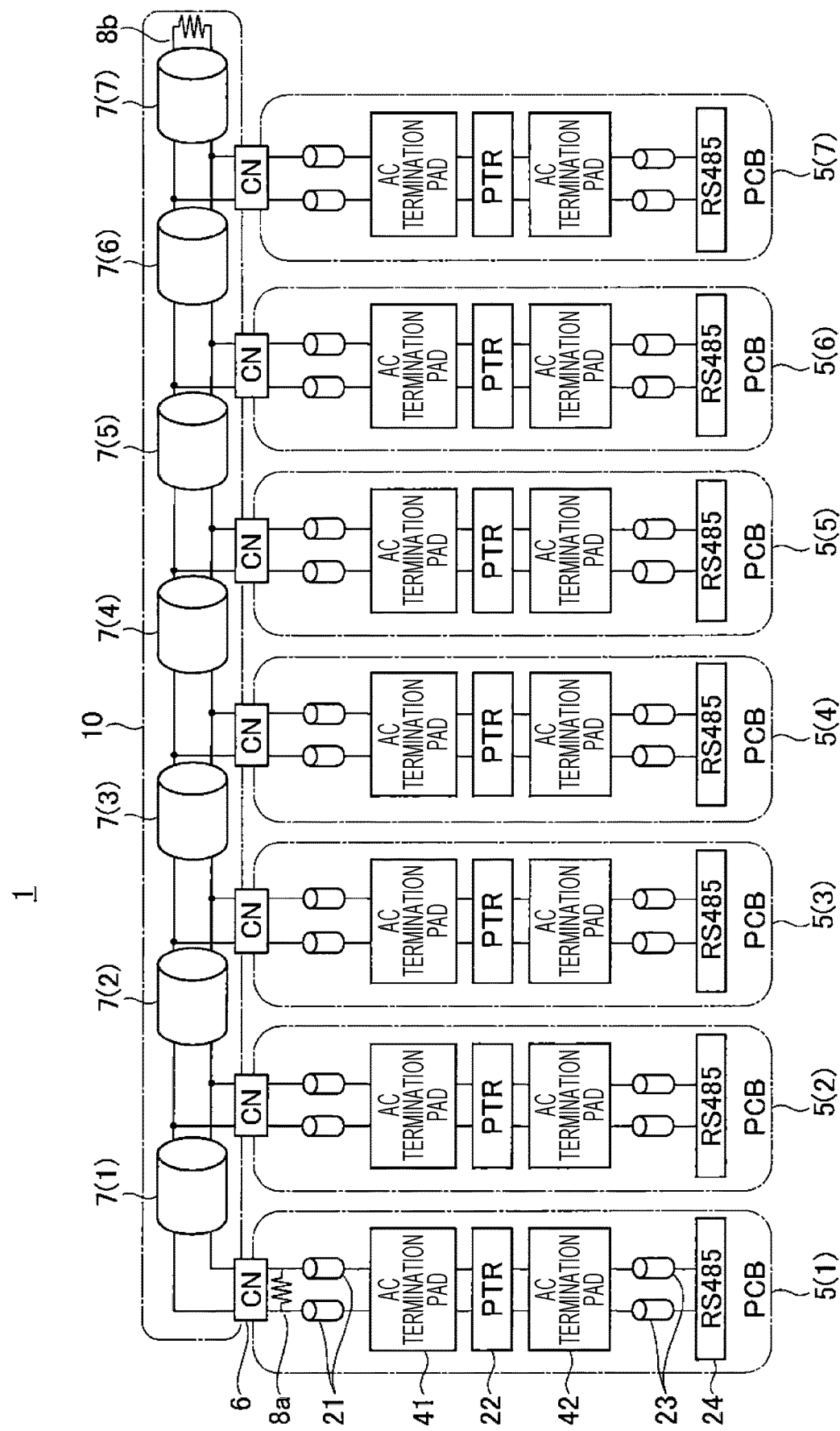
FIG. 5 is a block diagram illustrating an internal configuration example of a signal transmission device according to a first embodiment of the present invention.

Next, a configuration example of a signal transmission device according to a first embodiment of the present invention will be described with reference to FIG. 5 and subsequent drawings. FIG. 5 is a block diagram illustrating an internal configuration example of a signal transmission device 1 according to the first embodiment of the present invention. The signal transmission device 1 is an example of a signal transmission device to which a topology for solving the above-described problem is applied. Among configurations of the signal transmission device 1, configurations common to those of the conventional signal transmission device 100 illustrated in FIG. 2 are denoted by the same reference signs.

The signal transmission device 1 has a multi-point wiring structure in which termination resistors 8a and 8b are mounted on both ends of a cable 7, and a plurality of signal transmission substrates connected to the cable 7 transmit a signal through the cable 7. A PCB 5, which is an example of the signal transmission substrate forming the signal transmission device 1, includes: a connector 6 (an example of a connection unit) connected to the cable 7; a PCB transmission line 21 (an example of a first substrate internal transmission line), a PTR 22 (an example of a transformer unit), a PCB transmission line 23 (an example of a second substrate internal transmission line), and an RS485 transceiver 24 (an example of a transmission and reception unit). Note that a PCB 5(1) is provided with the termination resistor 8a (an example of a termination resistor) connected in parallel to the connector 6.

A difference between the configuration of the signal transmission device 1 according to the present embodiment and the configuration of the signal transmission device 100 having the conventional configuration illustrated in FIG. 2 is that the PCB 5 (an example of the signal transmission substrate) of the signal transmission device 1 includes AC termination pads 41 and 42 (examples of a termination unit mounting portion) configured to enable the AC termination (an example of a termination unit) to be mounted before and after the PTR 22. The AC termination pads 41 and 42 are provided on at least one of the PCB transmission line 21 and the PCB transmission line 23.

The connector 6 is connected to the cable 7 and sends a signal to or receives a signal from the cable 7. The PTR 22 is connected to the connector 6 via the PCB transmission line 21, and has a function of insulating the connector 6 and the RS485 transceiver 24. The RS485 transceiver 24 is connected to the PTRs 22 via the PCB transmission line 23, and transmits a signal to the PCB 5 of another node or receives a signal from the PCB 5 of another node.

As described above, the AC termination 30 includes a resistor and a capacitor. The AC termination 30 is provided in at least one of the PCB transmission line 21 and the PCB transmission line 23, and suppresses resonance and antiresonance in a reflection frequency characteristic of noise. Therefore, a place where the AC termination 30 is mounted is limited to places where the AC termination pads 41 and 42 are mounted. When the AC termination 30 is mounted on all of the AC termination pads 41 and 42, the number of components increases.

Therefore, only one AC termination 30 may be mounted even if the AC termination pads 41 and 42 are provided on the PCB 5. In this manner, the AC termination 30 illustrated in FIG. 3 is mounted on any one or both of the AC termination pads 41 and 42. Further, whether or not to mount the AC termination 30 may be determined depending on an inter-node distance, that is, a line length. Whether or not to mount the AC termination 30 is determined depending on the line length in accordance with a definition of the line length according to a second embodiment to be described later.

Reflection noise that lowers the signal quality is generated by causing unnecessary reflection in a specific frequency band indicated by a resonance point and an anti-resonance point of input impedances at both ends of the PTR 22. A reason thereof will be described with reference to FIGS. 6 to 9.

Figure 6:
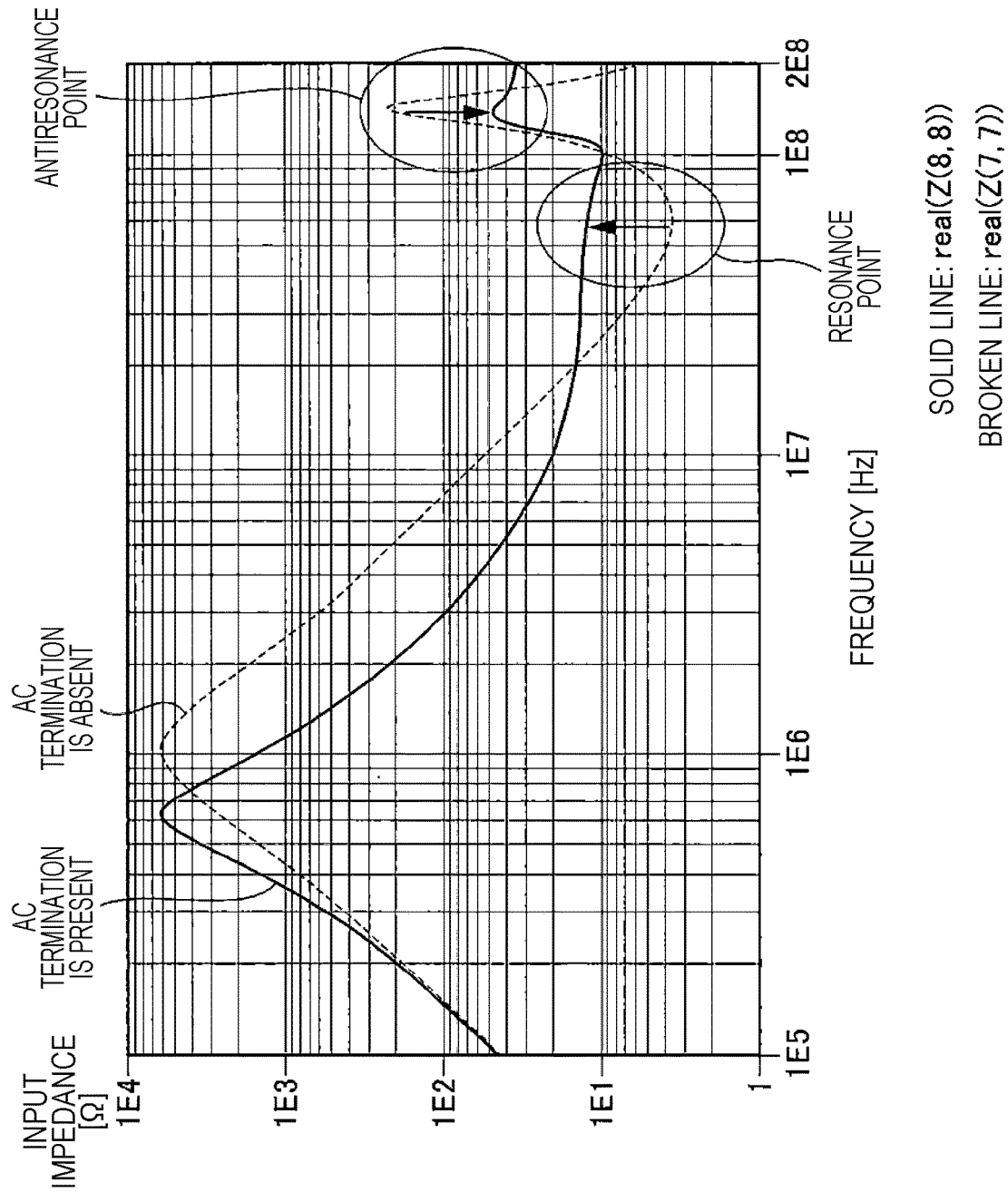
FIG. 6 is a diagram illustrating an example of an input impedance observed at an RS485 pin of a PCB in which AC termination is mounted on one side of a PTR according to the first embodiment of the present invention.
Figure 7:
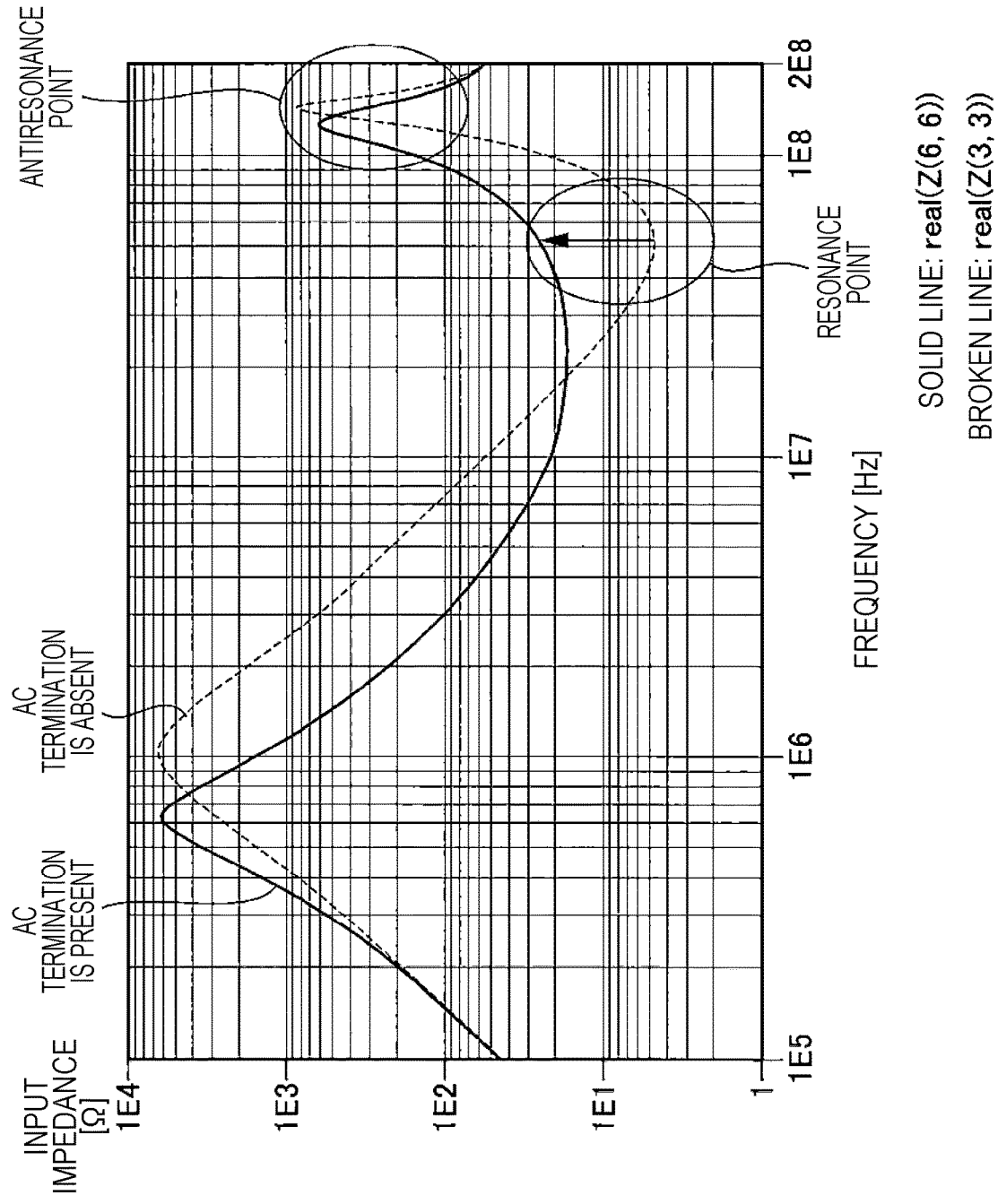
FIG. 7 is a diagram illustrating an example of an input impedance observed at a connector pin of the PCB in which the AC termination is mounted on one side of the PTR according to the first embodiment of the present invention.

First, a state of signal detection in the PCB 5 in which the AC termination 30 having a capacitor with a capacitance Ct of 47 pF is mounted only on the AC termination pad 42 between the PTR 22 and the RS485 transceiver 24 illustrated in FIG. 5 will be described with reference to FIGS. 6 and 7. In FIGS. 6 and 7, a horizontal axis represents a frequency [Hz], and a vertical axis represents an impedance [Ω].

FIG. 6 is a diagram illustrating an example of an input impedance observed at an RS485 pin of the PCB 5 in which the AC termination 30 is mounted on one side of the PTR 22. The RS485 pin is a signal detection pin (not illustrated) attached to the RS485 transceiver 24.

It can be seen that the depth and height of the input impedance at a resonance point and an anti-resonance point are suppressed in a graph in a case where the AC termination 30 is present, which is indicated by a solid line, as compared with a graph in a case where the AC termination 30 is absent which is indicated by a broken line in FIG. 6. When the AC termination 30 is present, a rapid change in the input impedance is reduced, and the noise affecting the signal quality is suppressed.

FIG. 7 is a diagram illustrating an example of an input impedance observed at a connector pin of the PCB 5 in which the AC termination 30 is mounted on one side of the PTR 22. The connector pin is a signal detection pin (not illustrated) attached to the connector 6.

In FIG. 7, it can be also seen that the depth of the input impedance is suppressed and negative reflection causing a waveform recess is alleviated in a graph in a case where the AC termination 30 is present, which is indicated by a solid line, as compared with a graph in a case where the AC termination 30 is absent which is indicated by a broken line. Further, the height of a resonance point is also suppressed on the RS485 transceiver 24 side that observes a waveform in signal transmission.

Figure 8:
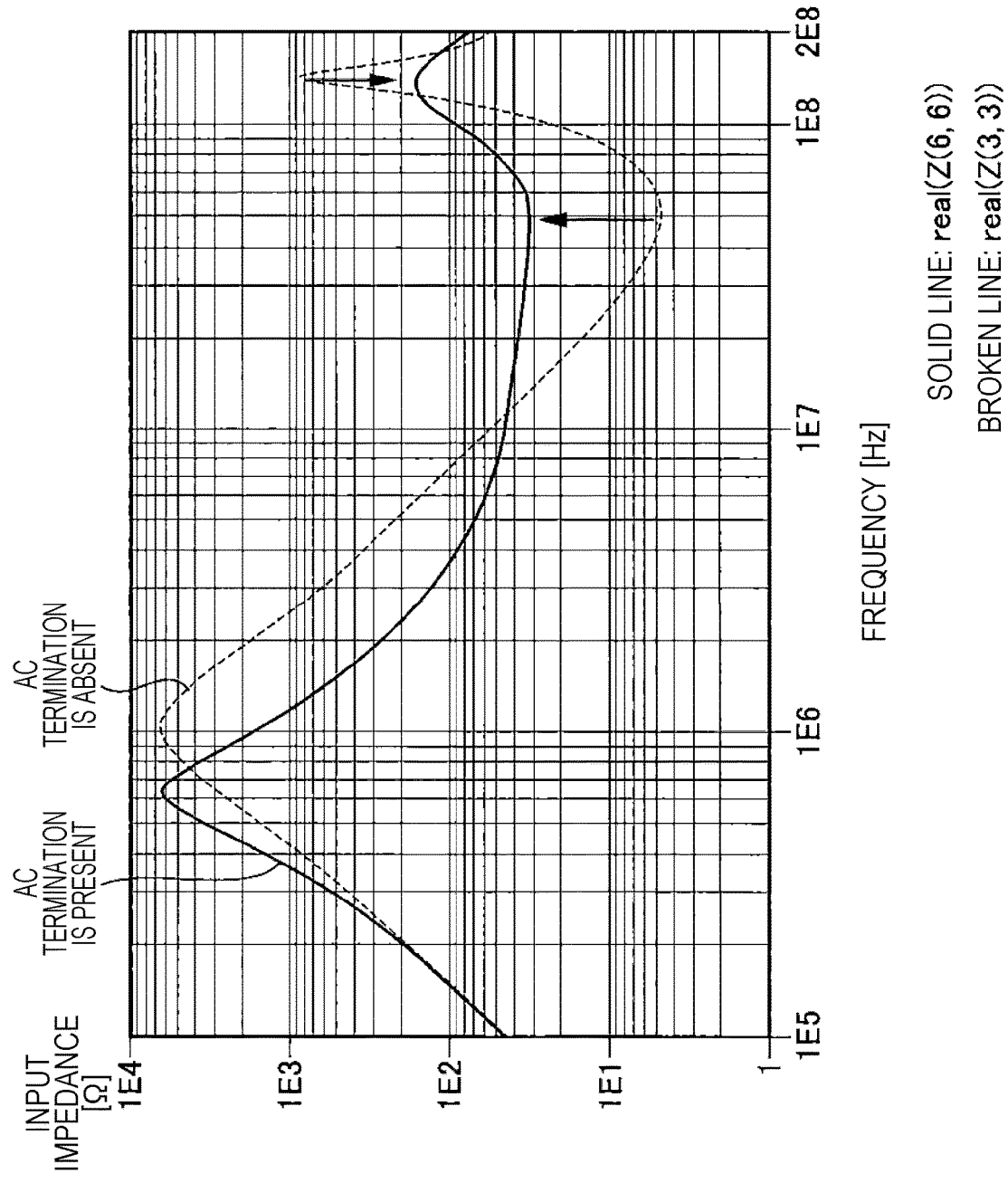
FIG. 8 is a diagram illustrating an example of an input impedance observed at an RS485 pin of a PCB in which AC termination is mounted on both sides of a PTR according to the first embodiment of the present invention.
Figure 9:
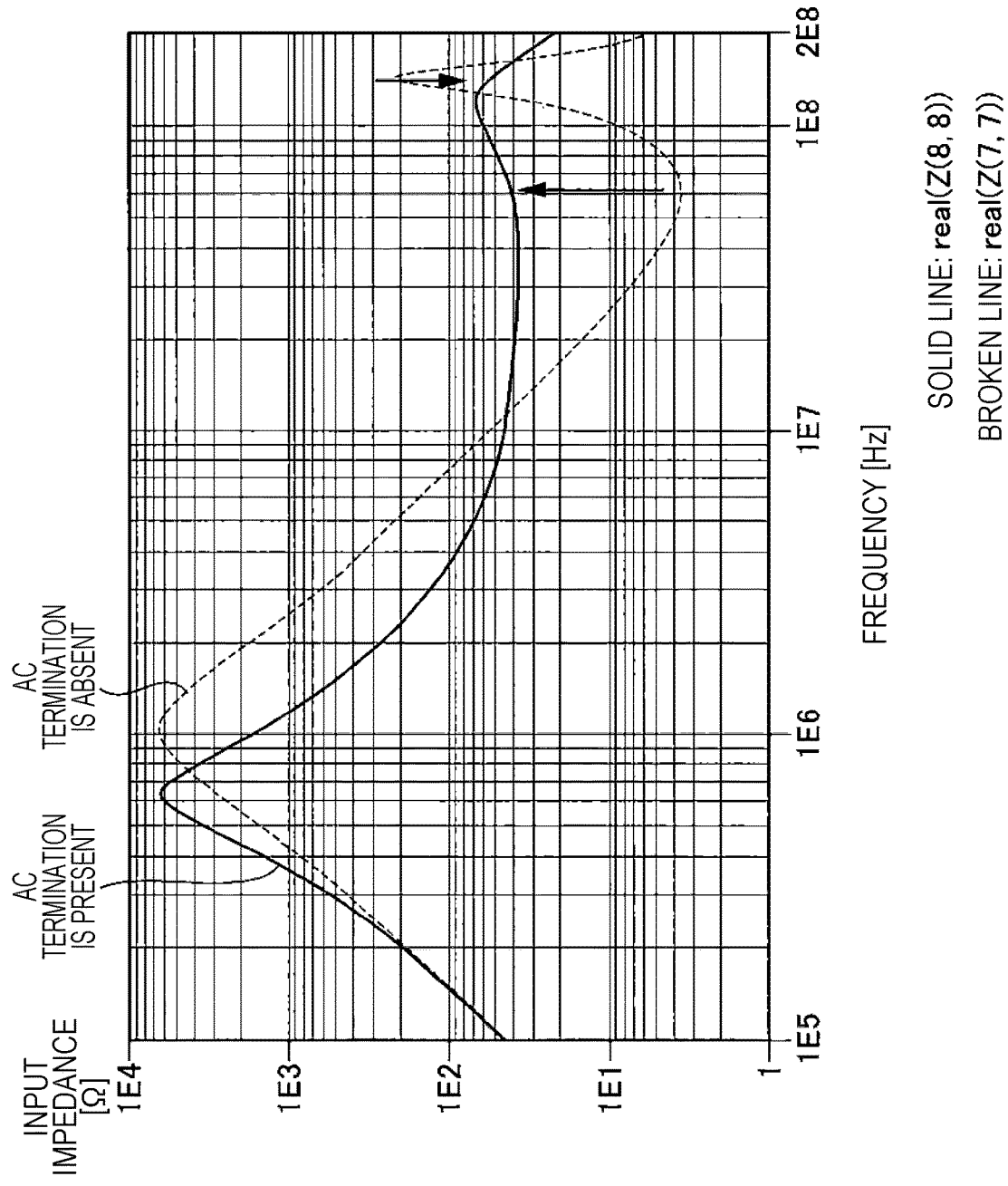
FIG. 9 is a diagram illustrating an example of an input impedance observed at a connector pin of the PCB in which the AC termination is mounted on the both sides of the PTR according to the first embodiment of the present invention.

Next, a state of signal detection in the PCB 5 in which the AC termination 30 having a capacitor with the capacitance Ct of 22 pF is mounted on both the AC termination pad 41 between the PTR 22 and the RS485 transceiver 24 and the AC termination pad 42 between the PTR 22 and the connector 6 illustrated in FIG. 5 will be described with reference to FIGS. 8 and 9. In FIGS. 8 and 9, a horizontal axis represents a frequency [Hz], and a vertical axis represents an impedance [Ω].

FIG. 8 is a diagram illustrating an example of an input impedance observed at an RS485 pin of the PCB 5 in which the AC termination 30 is mounted on both sides of the PTR 22. FIG. 9 is a diagram illustrating an example of an input impedance observed at a connector pin of the PCB 5 in which the AC termination 30 is mounted on the both side of the PTR 22. In the case where the AC termination 30 is mounted on the both sides of the PTR 22, not only a height change of a resonance point but also a height change of an anti-resonance point on the connector 6 side is alleviated as illustrated in the input impedances of FIGS. 8 and 9.

Therefore, it is desirable to mount the AC termination 30 on the both sides of the PTR 22, but the number of mounted components increases. Even when the AC termination 30 is mounted only on one side of the PTR 22 as illustrated in FIGS. 6 and 7, an effect of improving the waveform quality is exhibited. In this manner, any scheme may be adopted according to the required waveform quality.

Figure 10:
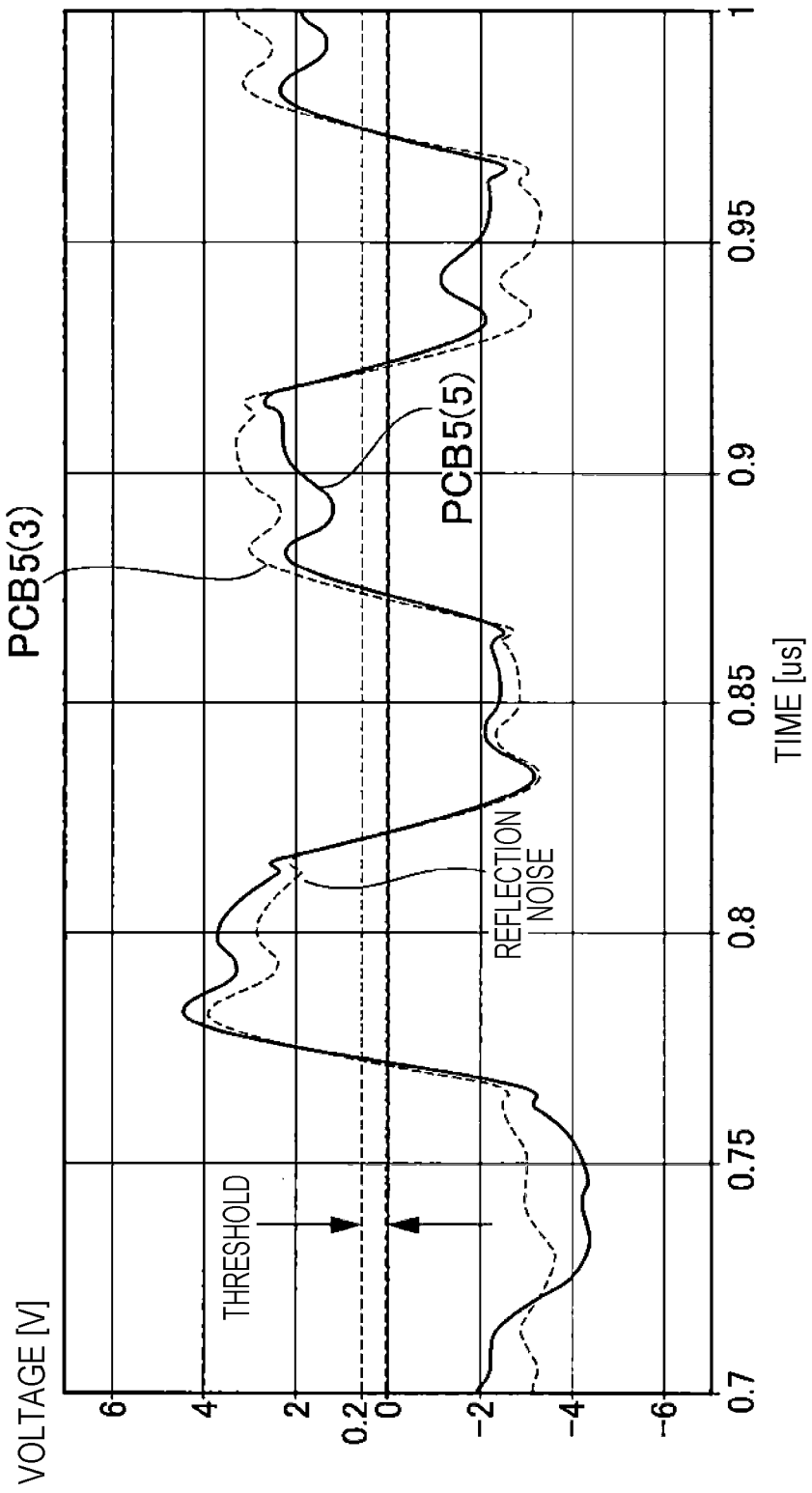
FIG. 10 is a diagram illustrating an example of a waveform observed in an RS485 transceiver of a PCB in which AC termination is mounted between a PTR and the RS485 transceiver according to the first embodiment of the present invention.

Next, a mode in which the AC termination 30 is mounted on one side of the PTR 22 will be described again. FIG. 10 is a diagram illustrating an example of a waveform observed in the RS485 transceiver 24 of the signal transmission substrate on which the AC termination 30 is mounted between the PTR 22 and the RS485 transceiver 24. Here, the AC termination 30 with Ct=47 pF and Rt=33Ω is mounted between the PTR 22 and the RS485 transceiver 24 with respect to the signal transmission device 100 having the conventional configuration illustrated in FIG. 2 in which the waveform illustrated in FIG. 3 in which the reflection noise bites into the threshold is observed.

FIG. 10 illustrates that the waveform recess is alleviated and the waveform noise that bites into the threshold is no longer generated. Therefore, it can be seen that the effect of improving the waveform quality is exhibited with respect to the noise causing the waveform recess even if the capacitor having the capacitance Ct of about 47 pF is attached to the PCB 5.

In the signal transmission device 1 according to the first embodiment described above, the AC termination 30 that suppresses the resonance and antiresonance in each reflection frequency characteristic is mounted on at least one of the AC termination pads 41 and 42, that is, on the both sides or one side of the PTR 22 mounted on each of the PCBs 5. Therefore, even if reflection noise from the PTR 22 of another node and reflection noise from the PTR 22 mounted on the other node due to a signal change of the own bit are superimposed using the Manchester encoding scheme for preventing deflection of a DC level, a waveform recess in a node as a transmission destination of a signal is alleviated, and the waveform noise that bites into the threshold is not generated. Therefore, the quality of the signal transmitted and received by each signal in the signal transmission device 1 is improved, and the accuracy of signal reading in the RS485 device 3 is also improved.

Further, in the signal transmission device 1, in order to insulate each node, a large PTR on the order of 1 mH, which does not cause magnetic saturation even with a signal of several hundred kbps in which a time per bit is on the order of µs can be commonly used from several hundred kbps to a data rate of 10 Mbps (20 MHz) or more.

Note that the termination resistors 8a and 8b are connected to both ends of the topology even in the signal transmission device 1. The termination resistors 8a and 8b may be inside or outside the PCB 5 as long as being located at the both ends of the topology, and it is preferable to match a resistance value with a line impedance of the cable 7. However, the waveform distortion is alleviated by the mounted AC termination 30 even in a case where various lines of 100 to 150Ω have to be mixed between nodes. Therefore, it is unnecessary to perform forced matching in order to secure the signal amplitude from the viewpoint of preventing erroneous signal detection, and the resistance values of the termination resistors 8a and 8b may be selected between 100 to 200Ω in accordance with a desired signal amplitude.

Second Embodiment

Meanwhile, in a case where a signal is transmitted with 1:N connection among nodes, a C component of the AC termination 30 is accumulated, and this C component causes attenuation of a signal. Therefore, when a data rate is increased or the number of nodes is increased, as small the AC termination 30 as possible may be selected, and further, the mounting of the AC termination 30 may be avoided depending on a line length to be connected. It is also possible to reduce the components of the PCB 5 by avoiding the mounting of the AC termination 30.

Therefore, in a signal transmission device 1 according to a second embodiment of the present invention, the influence of noise can be suppressed by adjusting an inter-node distance without mounting an AC termination 30 on a PCB 5. That is, in the signal transmission device 1 according to the second embodiment, a line length between a connector 6 of a host node and the other connector 6 of the PCB 5 of the other node is set to a length calculated from a time during which a signal is reciprocally transmitted, the time equivalent to an integral multiple of a signal change period using a Manchester encoding scheme. Hereinafter, an operation example of the signal transmission device 1 according to the second embodiment will be described with reference to FIGS. 11 and 12.

In a case of using the Manchester encoding scheme in which a signal is changed such that on or off is continued for two bits at the maximum in the signal transmission device according to the second embodiment, a signal transmission time between nodes can be set to an inter-node distance of a line length corresponding to a time of two bits.

Therefore, the inter-node distance is set such that a superimposing timing of noise reflected from the other PTR 22 in the PCB 5 of the other node, which is the noise superimposed on a signal transmitted from the PCB 5 of the other node toward the PCB 5 of the host node, is matched with the signal change period. For example, noise entering a threshold is superimposed within a rise time Tr and a fall time Tf illustrated in FIGS. 13 and 14 which will be described later. That is, the influence of noise on signal reading is reduced by adopting the line length in which the noise is superimposed at the timing when the signal changes. That is, the influence of noise at the time of signal reading can be reduced by matching the inter-node distance with a reciprocation delay time of one bit.

Figure 11:
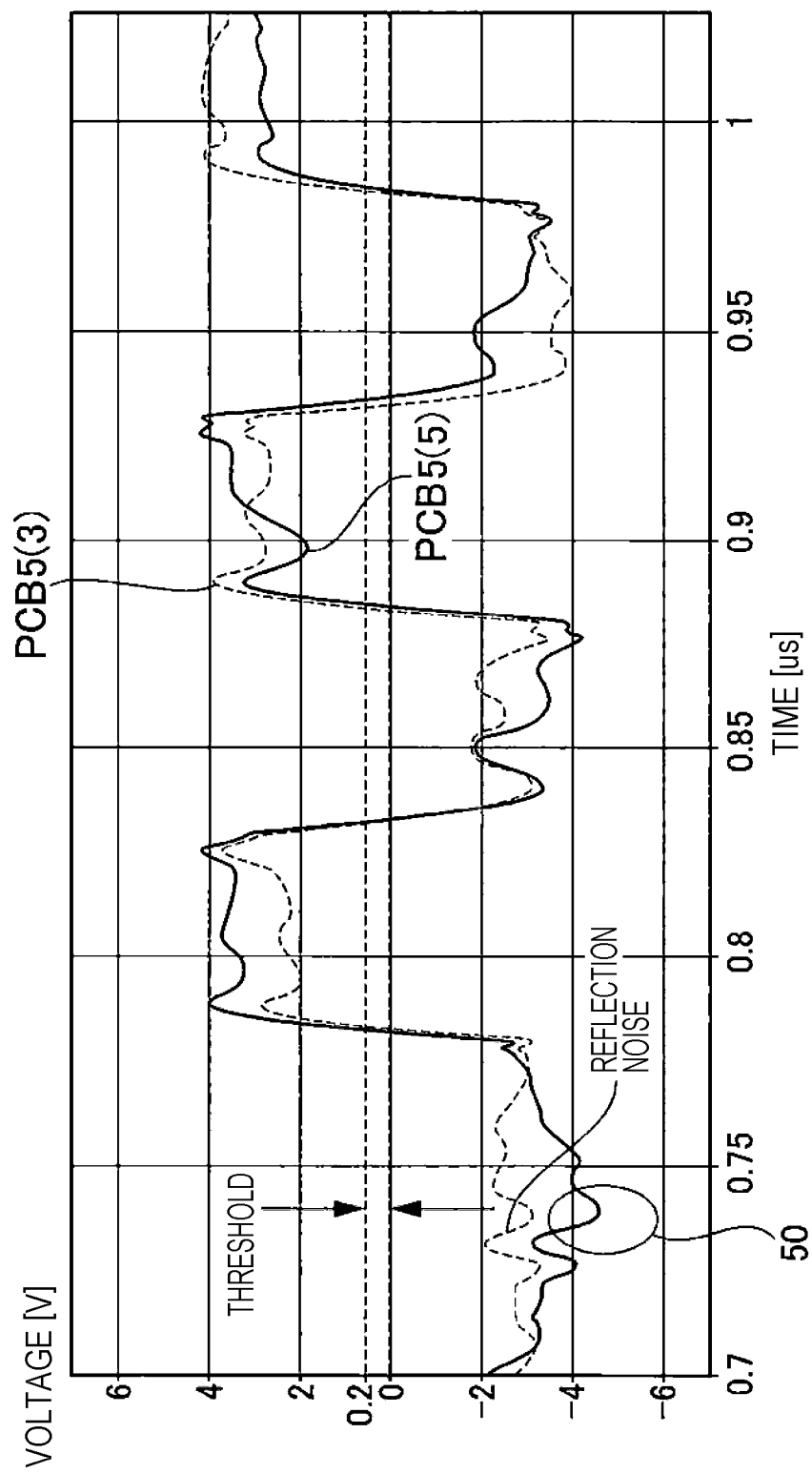
FIG. 11 is a diagram illustrating examples of waveforms observed at adjacent nodes when an intermediate node is driven with an inter-node distance of 5 m in a signal transmission device according to a second embodiment of the present invention.

FIG. 11 is a diagram illustrating examples of waveforms observed at adjacent nodes when an intermediate node is driven with an inter-node distance of 5 m in the signal transmission device 1. The waveforms illustrated in FIG. 11 are observed in the signal transmission device 1 in which the inter-node distance is set to a length obtained by converting a transmission time for one bit into 50 ns. The intermediate node is a PCB 5(4), and the adjacent nodes are a PCB 5(3) and a PCB 5(5).

Here, illustrated are examples of the waveforms observed in a case where a line length is restricted such that a reflected wave from another node arrives after a lapse of an integral multiple of 50 ns since a signal first reaches the PCB 5(3) and the PCB 5(5) when a signal transmission speed in a cable 7 is set to 200 mm/ns. Here, the transmission time for one bit in the adjacent node is defined as 50 ns. A broken line illustrated in FIG. 11 represents a voltage change of a signal observed at the PCB 5(3), and a solid line represents a voltage change of a signal observed at the PCB 5(5).

Here, a period between 0.7 and 0.78 µs represents that two bits having the same sign are consecutive. Reflection noise toward a threshold can be confirmed from the waveform of the PCB 5(3). Further, superimposition of noise toward the outside of an amplitude voltage range in a 2-bit consecutive portion 50 can be confirmed from the waveform of the PCB 5(5). However, the waveform illustrated in FIG. 11 illustrates that the height of the reflection noise caused after the rise or fall of the waveform confirmed in FIG. 3 has been alleviated. Therefore, even in the case where two bits having the same sign are consecutive in the signal transmission device 1 configured such that the inter-node distance is 10 m, there is no problem in the signal reading of the node that receives the signal.

Figure 12:
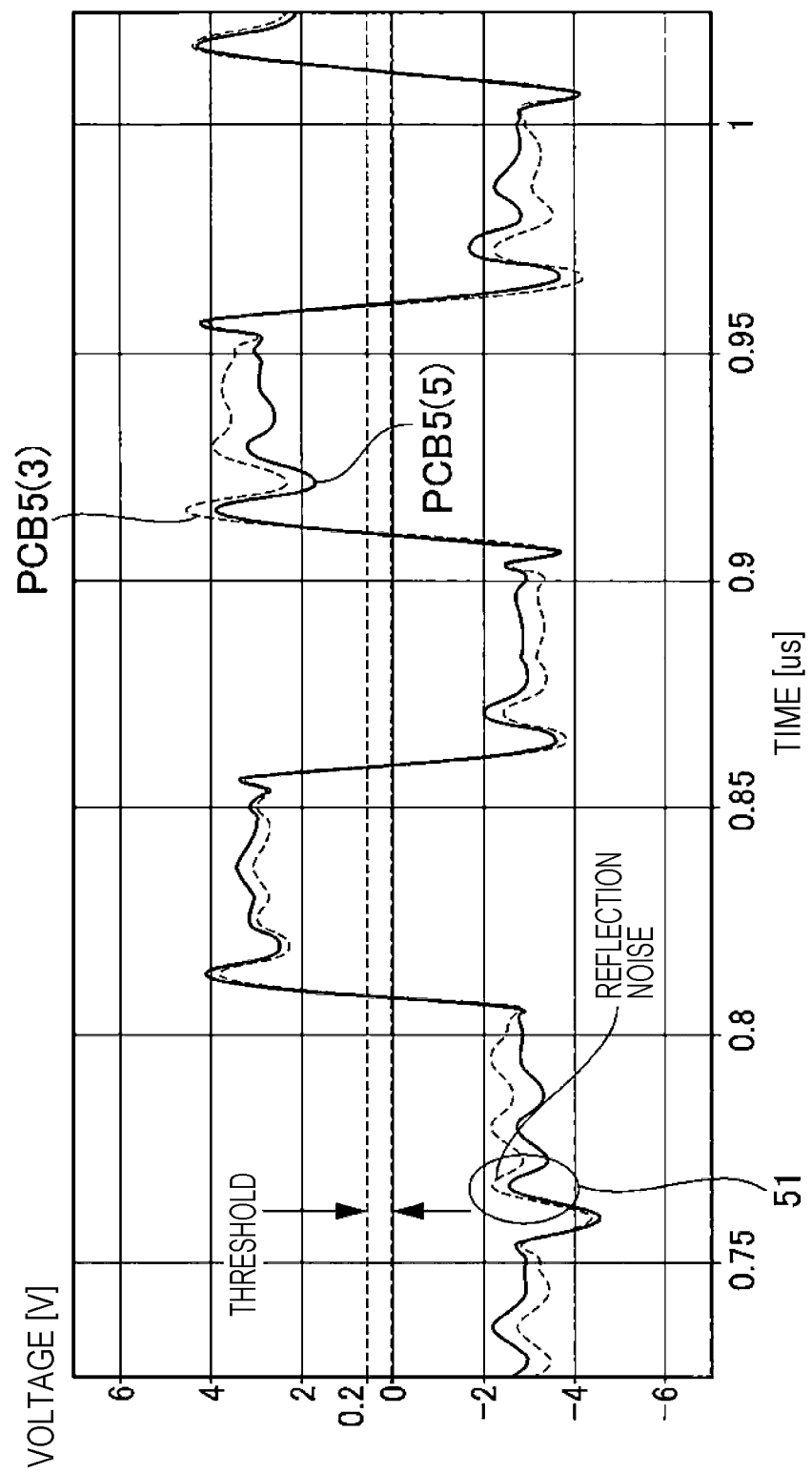
FIG. 12 is a diagram illustrating examples of waveforms observed at adjacent nodes when an intermediate node is driven with an inter-node distance of 10 m in the signal transmission device according to the second embodiment of the present invention.

FIG. 12 is a diagram illustrating examples of waveforms observed at adjacent nodes when an intermediate node is driven with an inter-node distance of 10 m in the signal transmission device 1. The waveforms illustrated in FIG. 12 are observed in the signal transmission device 1 in which the inter-node distance is set to a length obtained by converting the transmission time for one bit into 100 ns. Even in FIG. 12, the intermediate node is the PCB 5(4), and the adjacent nodes are the PCB 5(3) and the PCB 5(5).

Here, illustrated are examples of the waveforms observed in a case where a line length is restricted such that a reflected wave from another node arrives after a lapse of an integral multiple of 100 ns since a signal first reaches the PCB 5(3) and the PCB 5(5) when a signal transmission speed in a cable 7 is set to 200 mm/ns. In FIG. 12, a broken line represents a voltage change of a signal observed at the PCB 5(3), and a solid line represents a voltage change of a signal observed at the PCB 5(5).

Even in this case, a period between 0.7 and 0.78 µs represents that two bits having the same sign are continuous. The waveforms of the PCBS (3) and the PCBS (5) illustrate that the height of the reflection noise generated after the rise or fall of the waveform confirmed in FIG. 3 has been alleviated in the both.

Note that, superimposition of noise toward the inside of the amplitude voltage range is confirmed in a 2-bit consecutive portion 51 illustrated in FIG. 12, which is different from the 2-bit consecutive portion 50 illustrated in FIG. 11. However, this noise does not enter a threshold. Therefore, even in the signal transmission device 1 configured such that the inter-node distance is 10 m, there is no problem in the signal reading of the node that receives the signal when two bits having the same sign are consecutive.

As a result, even in a case of adopting a multi-point wiring structure that enables signal transmission from several hundred Kbps to the order of several tens of Mbps using the PTR 22 of 1 µH having large line-to-line capacitance and leakage inductance, a waveform recess can be avoided without mounting the AC termination 30.

That is, the signal transmission device 1 according to the second embodiment adopting this scheme is suitable in a case where the line length represented by the inter-node distance can be restricted. In a place where the line length is not restricted, the number of parts can be further reduced by mounting the AC termination 30 described above, and further, a cumulative capacitance of a capacitance Ct of a capacitor forming the AC termination 30 can be suppressed.

Figure 13:
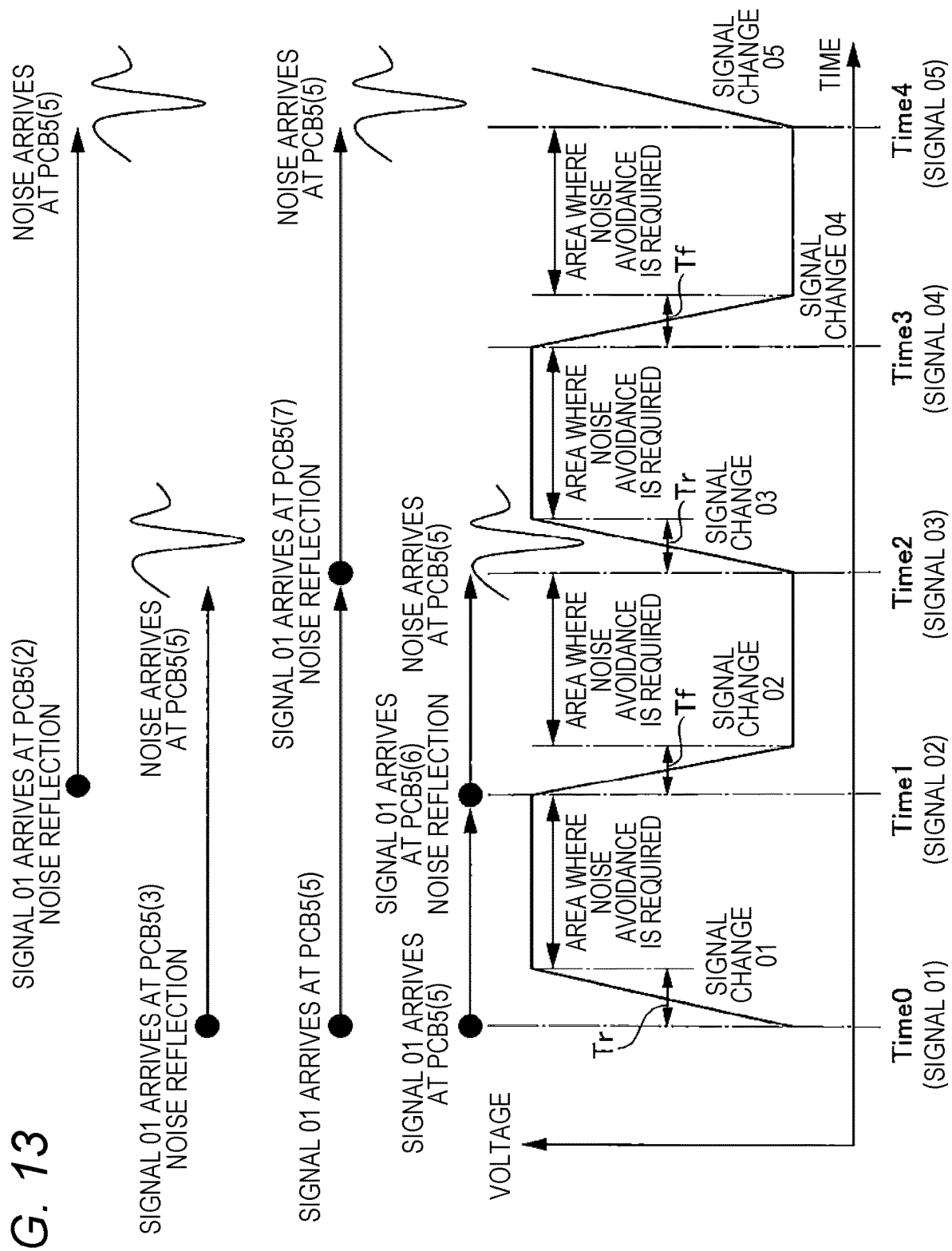
FIG. 13 is a schematic view illustrating an example of a timing at which noise is superimposed on a signal in a case where a line delay time according to the second embodiment of the present invention is equivalent to an integral multiple of a 1-bit time.

FIG. 13 is a schematic view illustrating an example of a timing at which noise is superimposed on a signal in a case where a line delay time is equivalent to an integral multiple of a 1-bit time. This schematic view illustrates a mechanism of line length adjustment. Here, examples of a signal change at the PCB 5(5) and noise arriving at the PCB 5(5) are illustrated. Here, the signal changes to on or off every 1-bit time.

(Time0)

First, it is assumed that Signal 01 is driven by the PCB 5(4). Then, the time when Signal 01 driven by the PCB 5(4) arrives at the PCB 5(5) is set as Time0. At this time, the signal also arrives at the PCB 5(3).

(Time1)

At Time1, Signal 02, which is the next signal change of Signal 01, arrives at the PCB 5(5). At this time, a time chart is represented as Signal Change 02. At Time1, Signal 01 arrives at a PCB 5(2) and a PCB 5(6), and reflection noise occurs. This reflection noise is reflected from a node as a generation source of the reflection noise to another node (which is described as "noise reflection" in FIG. 13).

(Time2)

At Time2, Signal 03, which is the next signal change of Signal 02, arrives at the PCB 5(5). At this time, a time chart is represented as Signal Change 03. At Time2, reflection noise generated in the PCB 5(3) at Time0 and reflection noise generated in the PCB 5(6) at Time1 arrive at the PCB 5(5). Here, a rise timing of Signal Change 03 and the reflection noise overlap with each other at the PCB 5(5), and thus, the waveform having the recessed shape that bites into the threshold as illustrated in FIG. 3 is not formed.

(Time3)

At Time3, Signal 04, which is the next signal change of Signal 03, arrives at the PCB 5(5). At this time, a time chart is represented as Signal Change 04.

(Time4)

At Time4, Signal 05, which is the next signal change of Signal 04, arrives at the PCB 5(5). At this time, a time chart is represented as Signal Change 05. At Time4, reflection noise generated in the PCB 5(2) at Time1 and reflected noise generated at a PCB 5(7) at Time2 overlap with a rise timing of Signal Change 05, and thus, the waveform having the recessed shape that bites into the threshold as illustrated in FIG. 3 is not formed. Note that the noise superimposed on Signal 05 at Time4 passes through a branch in the middle between nodes or the PTR 22 of the PCB 5(5), thereby being attenuated as compared with the noise superimposed at Time2.

Figure 14:
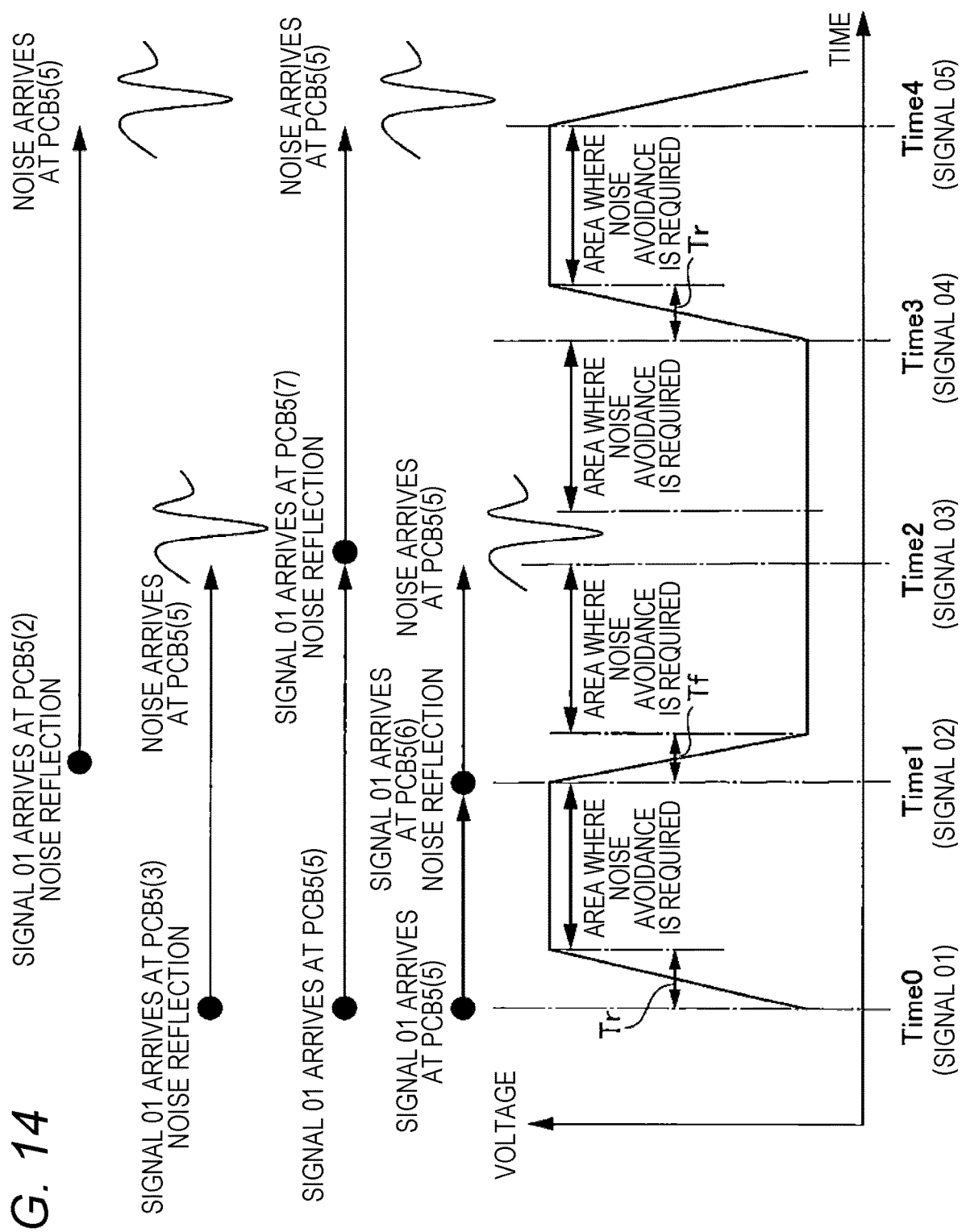
FIG. 14 is a schematic view illustrating an example of a timing at which noise is superimposed on a signal in a case where the line delay time according to the second embodiment of the present invention is equivalent to an integral multiple of a 1-bit time and two identical bits are consecutive.

FIG. 14 is a schematic view illustrating an example of a timing at which noise is superimposed on a signal in a case where the line delay time is equivalent to an integral multiple of a 1-bit time and two identical bits are consecutive. Here, a signal changes to on or off every 1-bit time or every 2-bit time.

States where a signal arrives at each of the PCBs 5 and noise reflection is performed at Time0 to Time4 are the same as those illustrated in FIG. 13. However, FIG. 14 is based on the premise of signal transmission in a Manchester encoding scheme in which two identical bits are allowed to be consecutive at the maximum. For example, between Time1 to Time3, two identical bits whose signals are set to off are consecutive. However, even if noise is superimposed between two consecutive bits of the same bit, the noise can be prevented from being superimposed on a noise avoidance area by adjusting the line length.

Therefore, the inter-node distance is adjusted to a length obtained by calculating a reciprocal transmission time during which a signal reciprocates between nodes, that is, a delay time, from a time equivalent to a multiple of a bit rate of the Manchester encoding scheme. For example, 10 MHz is set in the case of 10 Mbps, and the inter-node distance is adjusted to a length calculated from a time equivalent to an integral multiple of a unit time of 50 ns of the signal change, whereby the waveform recess reaching the threshold can be suppressed.

As a result, a low speed range of 400 kbps to a high speed range of about 20 Mbps in insulated transmission with the Manchester encoding scheme using the PTR 22 can be realized by a common line using the same pulse transformer.

In the signal transmission device 1 according to the second embodiment described above, the inter-node distance between adjacent nodes is selected such that the delay time is an integral multiple of a signal change cycle corresponding to a data rate. At this time, the inter-node distance is selected such that the reciprocal transmission time between nodes, that is, the delay time, is an integral multiple of the length calculated from the time equivalent to a multiple of the signal change period of the Manchester encoding scheme. Then, the waveform recess reaching the threshold is suppressed by matching the noise superimposition timing with the signal change. In the PCB 5 of the node in which such an inter-node distance is selected, the AC termination 30 is not mounted. Therefore, the number of components of the PCB 5 can be reduced. Furthermore, the cumulative capacitance of the capacitance Ct of the capacitor forming the AC termination 30 in the wiring can be reduced.

Even in the signal transmission device 1 according to the second embodiment, at least one of the AC termination pads 41 and 42 may be mounted on the PCB 5, and the AC termination 30 may be provided in at least one of the AC termination pads 41 and 42, which is similar to the signal transmission device 1 according to the first embodiment.

That is, even in the signal transmission device 1 according to the first embodiment, the line length between the connector 6 of the host node and the other connector 6 of the PCB 5 of the other node may be set to the length calculated from the time during which the signal is reciprocally transmitted, the time equivalent to an integral multiple of the signal change period using the Manchester encoding scheme as described in the signal transmission device 1A according to the second embodiment. That is, the inter-node distance may be set to the length obtained by calculating the reciprocal transmission time of the signal, that is, the delay time from the time equivalent to a multiple of a bit rate of the Manchester encoding scheme. Even in this case, the waveform recess reaching the threshold can be suppressed. In this manner, it is possible to reduce the cumulative capacitance of the capacitor forming the AC termination 30 in the line on which the signal is transmitted and received by mixing the selection of the inter-node distance and the mounting of the AC termination 30.

[Modifications]

Next, modifications of the signal transmission device will be described.

<Configuration in which Termination Resistor is Provided Outside PCB>

Figure 15:
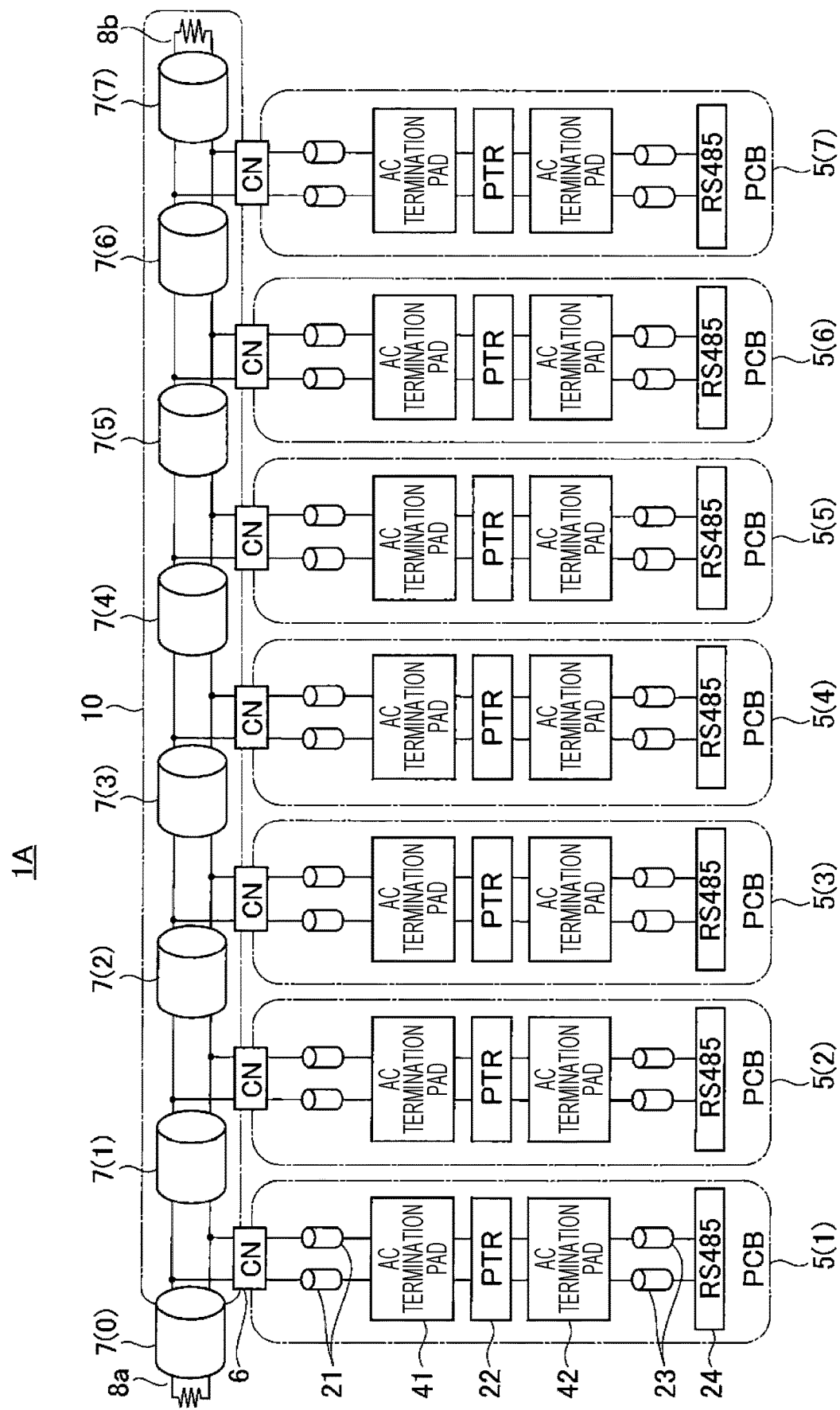
FIG. 15 is a block diagram illustrating a configuration example of a signal transmission device according to a modification of the first embodiment of the present invention.

FIG. 15 is a block diagram illustrating a configuration example of a signal transmission device 1A according to a modification. The signal transmission device 1A is different from the signal transmission device 1 according to the first embodiment illustrated in FIG. 5 in that a cable 7(0) connected to the cable 7(1) is provided, and the termination resistor 8a is formed outside the PCB 5(1). That is, the termination resistor 8a is attached to an end of the cable 7(0).

The signal transmission device 1A having such a configuration also exerts functions and effects similar to those of the signal transmission device 1 illustrated in FIG. 5. In each of the PCBs 5 of the signal transmission device 1A, the AC termination 30 may be provided in at least one of the AC termination pads 41 and 42. Further, the AC termination 30 is not necessarily provided in each of the PCBs 5, and an inter-node distance may be set to a length obtained by calculating a reciprocal transmission time of a signal, that is, a delay time from a time equivalent to a multiple of a bit rate of a Manchester encoding scheme. The configuration of the signal transmission device 1A can also suppress a waveform recess reaching a threshold.

<Branch Configuration in Connector>

Meanwhile, the PCBs 5 installed in the respective nodes are connected to the cable 7 via the connector 6, so that the PCBs 5 are electrically connected to each other. In a signal transmission device used in industrial applications, it is necessary to enable insertion and removal of the PCB 5 from the connector 6 during the operation of the signal transmission device (referred to as "hot swap"). In addition, regarding the PCBs 5 of the respective nodes configured to have the multi-point wiring structure, it is also necessary to enable connection and disconnection of the PCBs 5 with respect to the cable 7, that is, the hot swap in the signal transmission device 1 or 1A in during the operation.

Figure 16:
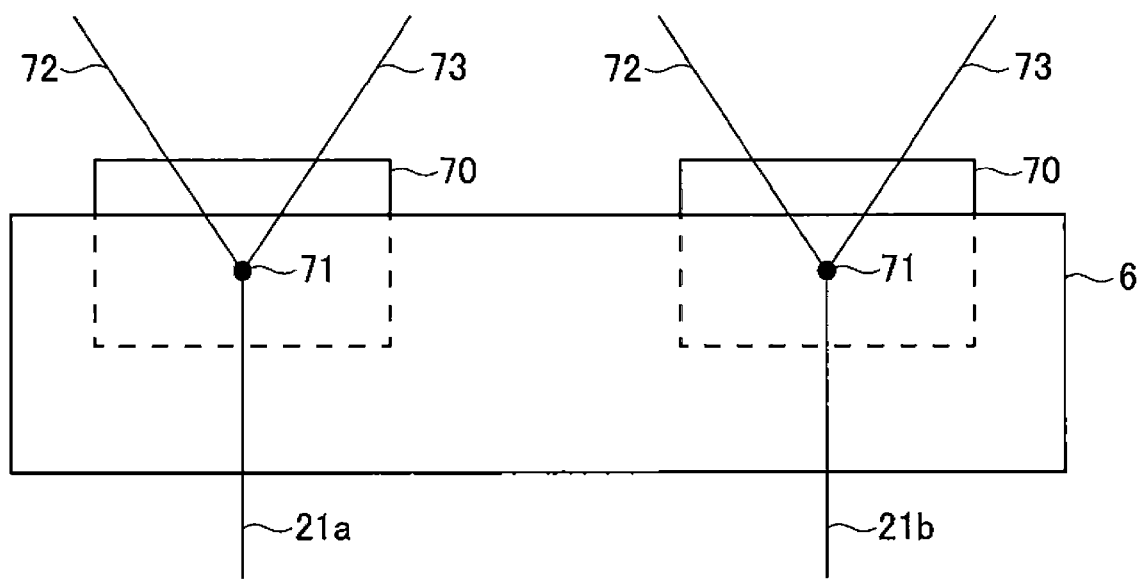
FIG. 16 is a diagram illustrating a configuration example of a branching unit provided in a connector according to a modification of the first embodiment of the present invention.

Therefore, there is known a scheme in which the PCB 5 is formed on a sub-substrate that allows hot swap to secure conduction in another node even when the PCB 5 of a certain node is disconnected from a signal transmission device. In this scheme, however, it is necessary to provide the PCB 5 in the state of being constantly connected to the cable 7, in addition to the PCB 5 that transmits and receives data. It is desirable to reduce the number of PCBs 5 in the state of being constantly connected to the cable 7 from the viewpoint of suppressing the number of parts of the entire signal transmission device. Therefore, the cable 7 may branch in the connector 6 in the signal transmission substrate according to the present embodiment. FIG. 16 is a diagram illustrating a configuration example of a branching unit 71 provided in the connector 6.

The connector 6 is provided on the PCB 5 side, and is a female connector into which two sets of cable-side connectors 70 (examples of a transmission-line-side connection unit) are inserted. On the other hand, a cable-side connector 70 which is configured on the cable 7 side and to which the connector 6 is connected includes the branching unit 71 that enables connection and disconnection of the PCB 5 during the operation of the signal transmission device 1.

One of the PCB transmission lines 21 illustrated in FIG. 5 is represented as a transmission line 21a illustrated in FIG. 16, and the other PCB transmission line 21 is represented as a transmission line 21b. The branching unit 71 has a function of dividing of a signal transmitted and received from a host node to an adjacent node. A line connected from the branching unit 71 to one of adjacent nodes is referred to as a cable line 72, and a line connected to the other adjacent node is referred to as a cable line 73.

A signal transmitted from the RS485 device 3 is divided by the branching unit 71 via the transmission lines 21a and 21b and transmitted to another node. Further, a signal transmitted from another node merges at the branching unit 71 and is input to the transmission lines 21a and 21b. Since the cable-side connector 70 includes the branching unit 71 as described above, the PCB 5 as the signal transmission substrate can be configured without a conventional sub-substrate. Therefore, the PCBs 5 of the respective nodes forming the multi-point wiring can be connected to and disconnected from each other during the operation of the signal transmission device 1 or 1A, that is, an insulated transmission wiring structure of the PTR 22 which enables the hot swap of the PCB 5 with respect to the cable 7 can be realized. Since the branching unit 71 that allows the hot swap is formed in the connector on the cable 7 side as described above, it is possible to eliminate the need for a sub-substrate for the signal branching that has been conventionally used.

Note that the present invention is not limited to the respective embodiments described above, and it is a matter of course that various other applications and modifications can be made without departing from a gist of the present invention described in the claims. For example, the above-described respective embodiments describe the detailed and concrete description of the configuration of the devices and the system in order to describe the present invention in an easily understandable manner, and are not necessarily limited to one including the entire configuration that has been described above. Further, some configurations of the embodiments described herein can be substituted by configurations of another embodiment, and further, a configuration of another embodiment can be added to a configuration of a certain embodiment. Further, addition, deletion or substitution of other configurations can be also made with respect to some configurations of each embodiment. Further, only a control line and an information line considered to be necessary for the description have been illustrated, and all control lines and information lines required for a product are not illustrated. It may be considered that most of the configurations are practically connected to each other.

What is claimed is:

1. A signal transmission device having a multi-point wiring structure in which termination resistors are mounted at both ends of a transmission line, and a plurality of signal transmission substrates connected to the transmission line transmit a signal through the transmission line, wherein
one signal transmission substrate among the signal transmission substrates includes:
a connection unit that is connected to the transmission line and transmits the signal to the transmission line or receives the signal from the transmission line;
a transformer unit that is connected to the connection unit via a first substrate internal transmission line and insulates the connection unit;
a transmission and reception unit that is connected to the transformer unit via a second substrate internal transmission line and transmits the signal to another signal transmission substrate among the signal transmission substrates or receives the signal from the other signal transmission substrate; and
a termination unit that is provided in at least one of the first substrate internal transmission line and the second substrate internal transmission line and suppresses resonance and antiresonance in a reflection frequency characteristic of noise.

2. The signal transmission device according to claim 1, further comprising
a termination unit mounting portion provided in at least one of the first substrate internal transmission line and the second substrate internal transmission line,
wherein the termination unit is mounted on at least one of the termination unit mounting portions.

3. The signal transmission device according to claim 2, wherein
whether or not the termination unit is mountable is determined depending on a line length between the connection unit and another connection unit included in the other signal transmission substrate.

4. The signal transmission device according to claim 1, wherein
a transmission-line-side connection unit which is formed on a side of the transmission line and to which the connection unit is connected includes a branching unit that enables connection and disconnection of the signal transmission substrate during operation of the signal transmission device.

5. A signal transmission device having a multi-point wiring structure in which termination resistors are mounted at both ends of a transmission line, and a plurality of signal transmission substrates connected to the transmission line transmit a signal through the transmission line, wherein
one signal transmission substrate among the signal transmission substrates includes:
a connection unit that is connected to the transmission line and transmits the signal to the transmission line or receives the signal from the transmission line;
a transformer unit that is connected to the connection unit via a first substrate internal transmission line and insulates the connection unit; and
a transmission and reception unit that is connected to the transformer unit via a second substrate internal transmission line and transmits the signal to another signal transmission substrate among the signal transmission substrates or receives the signal from the other signal transmission substrate, and
a line length between the connection unit and another connection unit included in the other signal transmission substrate is set to a length calculated from a time during which a signal is reciprocally transmitted, the time equivalent to an integral multiple of a signal change period using a Manchester encoding scheme.

6. The signal transmission device according to claim 5, wherein
the line length is set so as to match a superimposing timing of noise, which is reflected from another transformer unit included in the other signal transmission substrate and superimposed on the signal transmitted from the other signal transmission substrate toward the one signal transmission substrate, with a signal change period.

7. The signal transmission device according to claim 6, wherein
the one signal transmission substrate further includes
a termination unit that is provided in at least one of the first substrate internal transmission line and the second substrate internal transmission line and suppresses resonance and antiresonance in a reflection frequency characteristic of noise.

8. The signal transmission device according to claim 5 wherein
a transmission-line-side connection unit which is formed on a side of the transmission line and to which the connection unit is connected includes a branching unit that enables connection and disconnection of the signal transmission substrate during operation of the signal transmission device.

* * * * *